United States Patent
Masumura et al.

[11] Patent Number: 5,866,226
[45] Date of Patent: Feb. 2, 1999

[54] POLISHING AGENT USED FOR POLISHING SEMICONDUCTOR WAFERS AND POLISHING METHOD USING THE SAME

[75] Inventors: Hisashi Masumura; Kiyoshi Suzuki; Hideo Kudo; Teruaki Fukami, all of Fukushima-ken, Japan

[73] Assignee: Shin-Etsu Handotai Co., Ltd., Tokyo, Japan

[21] Appl. No.: 670,258

[22] Filed: Jun. 20, 1996

[30] Foreign Application Priority Data

Jun. 23, 1995 [JP] Japan .................................. 7-181130

[51] Int. Cl.⁶ .............................. B32B 3/02; H01L 29/00
[52] U.S. Cl. .............................................. 428/64.1; 148/33
[58] Field of Search ............................. 428/64.1; 148/33; 216/88, 89; 156/636.1

[56] References Cited

U.S. PATENT DOCUMENTS

| | | | |
|---|---|---|---|
| 4,276,114 | 6/1981 | Takano et al. | 156/636 |
| 5,139,571 | 8/1992 | Deal et al. | 106/3 |
| 5,429,711 | 7/1995 | Watanabe et al. | 216/52 |
| 5,494,862 | 2/1996 | Kato et al. | 156/636.1 |
| 5,534,294 | 7/1996 | Kubota et al. | 437/12 |

FOREIGN PATENT DOCUMENTS

| | | |
|---|---|---|
| 0 588 055 A2 | 3/1994 | European Pat. Off. . |
| 0 628 992 A2 | 12/1994 | European Pat. Off. . |
| 0 685 877 A2 | 12/1995 | European Pat. Off. . |
| 0 782 179 A | 7/1997 | European Pat. Off. . |

OTHER PUBLICATIONS

Jan Haisma et al., "Improved Geometry of Double–Sided Polished Parallel Wafers Prepared For Direct Wafer Bonding", Applied Optics, vol. 33, pp. 7945–7954 (1994).

Patent Abstracts of Japan, vol. 010, No. 217, 29 Jul. 1986 & JP 61 054614 A, 18 Mar. 1986.

*Primary Examiner*—R. Bruce Breneman
*Assistant Examiner*—George Goudreau
*Attorney, Agent, or Firm*—Armstrong, Westerman, Hattori, McLeland & Naughton

[57] ABSTRACT

A semiconductor wafer polishing agent contains mainly a silica containing polishing agent and is added with a polyolefin type fine particle material. The novel semiconductor wafer polishing agent is capable of low brightness polishing to the back face of the wafer, sensor detection of the front and back faces of the wafer, and suppression of dust to be generated by chipping of the back face of the wafer, thereby to increase the yield of semiconductor devices. A polishing method using the polishing agent and a novel semiconductor wafer having a back face with an unconventional surface shape are also disclosed.

8 Claims, 9 Drawing Sheets

F I G.11
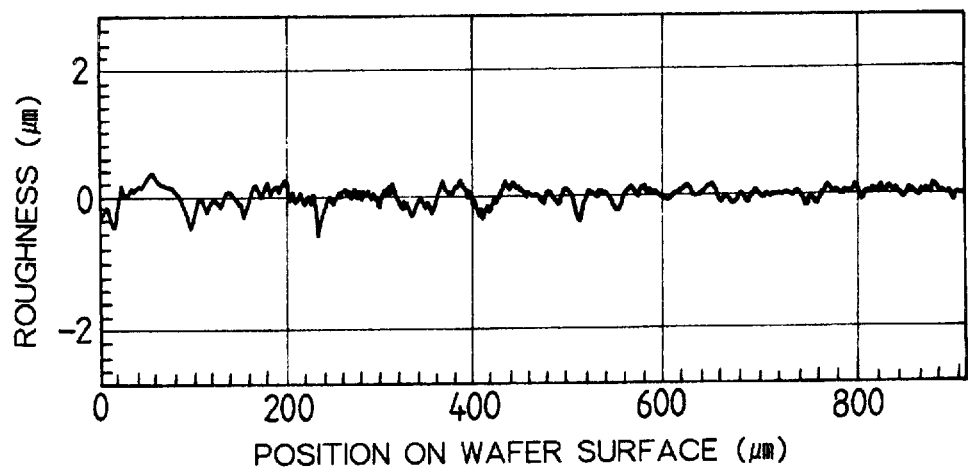
F I G.12
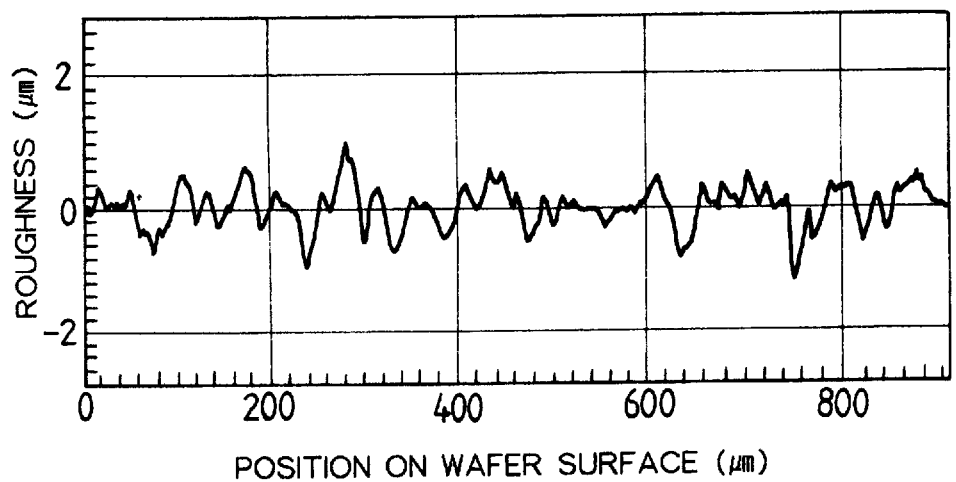

POLISHING AGENT USED FOR POLISHING SEMICONDUCTOR WAFERS AND POLISHING METHOD USING THE SAME

BACKGROUND OF THE INVENTION

1. Field of the Invention

The present invention relates to a polishing agent and a polishing method used for polishing semiconductor wafers, in particular, single-crystal silicon wafers (hereinafter may be referred to, for brevity, as "wafer"). Further, this invention relates to a novel semiconductor wafer having a back face with an unconventional surface shape.

2. Description of the Related Art

Generally, as shown in FIG. 10, the manufacturing method of semiconductor wafers includes a slicing process (A) to obtain wafers of thin disc type by slicing a single crystal ingot formed by a pulling process using a crystal pulling machine; a chamfering process (B) to chamfer a peripheral edge portion of the wafer obtained through the slicing process (A) to prevent cracking or breakage of the wafer; a lapping process (C) to flatten the surface of the chamfered wafer by lapping it; an etching process (D) to remove mechanical damage of the so chamfered and lapped wafer; a primary mirror polishing process (E1) to polish one side of the etched wafer to obtain a primary mirror surface of the wafer; a final mirror polishing process (G) to finally polish the surface of the so primary mirror polished wafer to obtain a final mirror surface of the wafer; and a washing process (H) for washing the finally mirror polished wafer to remove the polishing agent or dust particles from its surface.

As the etching process (D), there are two types of processes, that is, an acid etching process using an acid etching solution of a mixed acid or the like and an alkaline etching process using an alkaline etching solution of NaOH or the like. In the acid etching process, as shown in FIG. 11, a relatively high etching rate is obtained, and a surface roughness of an etched wafer is so fine that a cycle of the roughness is less than 10 $\mu$m and a P–V (Peak to Valley) value thereof is smaller than 0.6 $\mu$m. On the contrary, in the alkaline etching process, as shown in FIG. 12, a surface roughness of an etched wafer is so large that a cycle of the roughness is in the range of 10 to 20 $\mu$m and a P–V value thereof sometimes exceeds 1.5 $\mu$m.

However, in the semiconductor wafer produced through the respective processes shown in FIG. 10, the following problem has been seen because the back face of the etched wafer is left as etched to the final stage.

After the both faces of the wafer are etched in the etching process, only the front face of the wafer is subjected to mirror polishing in the next mirror polishing process. The polished front face of the wafer is not chucked as a vaccum chucking means and therefore offers no problem. However, when the back face of the etched wafer is chucked by such a chucking means, edged portions still remaining in the back face with relatively large surface roughness are chipped or broken to generate fine dust or a great number of fine particles, due to which the yield of semiconductor devices diminishes.

If both the front and back faces of the wafer are subjected to mirror polishing, there will be vanished relatively large surface roughness on the back face. Therefore, the generation of fine dust or particles described above can be prevented so that the problem caused by such fine dust or particles can also be solved.

However, according to the above both-face mirror polishing process, the back face also becomes a mirror surface.

Thus, respective sensors of processing machines can not distinguish the front face from the back face. Further, the so mirror polished wafer tends to slip out from a conveying line.

There have been no effective means capable of such low brightness polishing for semiconductor wafers that can satisfy the above face detection and wafer conveyance.

SUMMARY OF THE INVENTION

With the foregoing problems in view, it is an object of the present invention to provide a novel semiconductor wafer polishing agent which is capable of low brightness polishing to the back face of the wafer, sensor detection of the front and back faces of the wafer, and suppression of fine dust or particles generated by chipping of the back face of the wafer, thereby to increase the yield of semiconductor devices.

Another object of the present invention is to provide a semiconductor wafer polishing method using such novel polishing agent for enabling novel low brightness polishing of the semiconductor wafer.

Still another object of the present invention is to provide a novel semiconductor wafer having a back face with an unconventional surface shape.

In one aspect, the present invention seeks to provide a semiconductor wafer polishing agent which contains mainly a silica containing polishing agent and is added with a polyolefin type fine particle material.

The silica containing polishing agent includes a colloidal silica polishing agent, and it is preferred to use a polyolefin aqueous dispersion as the polyolefin type fine particle material. The amount of the polyolefin type fine particle material is in the range of 0.01 to 1 percent by weight, preferably 0.01 to 0.5 percent by weight, and optimally 0.01 to 0.1 percent by weight relative to the total amount of the polishing agent.

The polyolefin type fine particle material or polyolefin aqueous dispersion includes the aqueous dispersions disclosed in Japanese Patent Laid-open Publication Nos. 4-46904, 4-88025 to 88026, 4-89830 to 89832 and 4-218548 to 218549. Further, it is preferred to use CHEMIPEARL (trade name for a polyolefin aqueous dispersion manufactured by Mitsui Petrochemical Industries, Ltd.) which contains the above noted polyolefin type fine particle material or polyolefin aqueous dispersion.

In another aspect, the present invention seeks to provide a method of polishing a semiconductor wafer characterized by low brightness polishing using the above described semiconductor wafer polishing agent for polishing a semiconductor wafer.

In yet another aspect, the present invention seeks to provide a semiconductor wafer characterized by having a mirror surface as the front face and a low brightness polished face, as the back face, formed by the above low brightness polishing method.

In yet another aspect, the present invention seeks to provide a semiconductor wafer characterized in that the front face is a mirror surface and the back face has many semi-spherical small projections. Preferably, the height of the projections is in the range of 0.05 to 0.5 $\mu$m, and the diameter thereof is in the range of 50 to 500 $\mu$m.

The most important feature of the present invention is that low brightness polishing can be achieved by forming the semi-spherical small projections having a height of 50 to 500 $\mu$m and a diameter of 0.05 to 0.5 $\mu$m in the back face of a semiconductor wafer which is polished using a silica containing polishing agent added with a polyolefin type fine particle material. Accordingly, by mirror polishing the front face of the wafer and low brightness polishing the back face of the wafer, difference in brightness occurs between the front and back faces. Therefore, sensor detection of the front and back faces becomes possible. The term "brightness" denotes the percentage of the tested face reflectance relative to 100 of the perfect mirror surface reflectance.

Further, there can be suppressed the generation of dust from the back face of the wafer which is subjected to the low brightness polishing using the above silica containing polishing agent added with a polyolefin type fine particle material. For example, when the low brightness polished back face of the wafer is chucked in a photolithography process of a device manufacturing line, the generation of dust by chipping can be suppressed and thereby the yield of semiconductor devices can be increased.

In addition, the use of the semiconductor wafer polishing agent of the present invention makes it possible to obtain a semiconductor wafer having a novel back face shape.

The above and other objects, features and advantages of the present invention will become manifest to those versed in the art upon making reference to the detailed description and the accompanying sheets of drawings.

BRIEF DESCRIPTION OF THE DRAWINGS

FIG. 11 is a graph showing distribution of the surface roughness of a wafer subjected to acid etching; and FIG. 12 is a graph showing distribution of the surface roughness of a wafer subjected to alkaline etching.

DETAILED DESCRIPTION

The present invention will be described below in greater detail by way of the following examples which should be construed as illustrative rather than restrictive.

Figure 8:
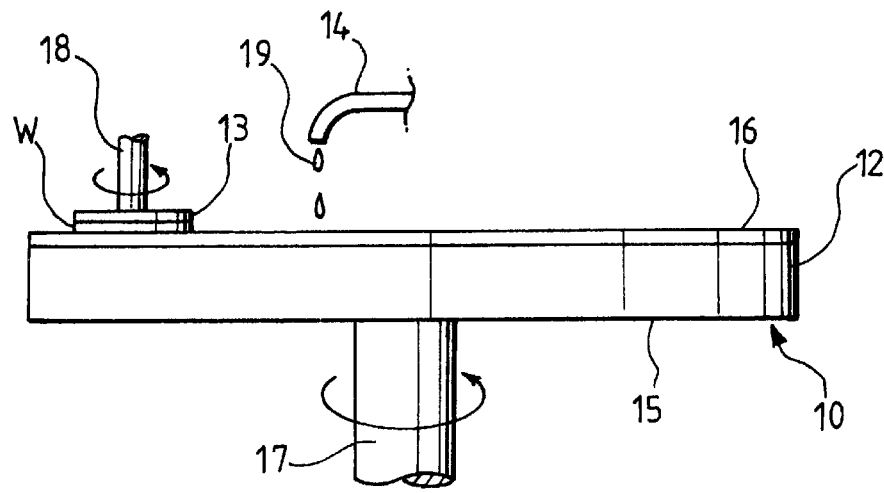
FIG. 8 is a side elevation showing a polishing machine used in the Example and Comparative Examples.

FIG. 8 shows an apparatus 10 for polishing a single crystal silicon wafer W, to carry out polishing processes in Experiment 1, Example 1 and Comparative Examples 1–3.

In FIG. 8, the apparatus 10 comprises a rotary table assembly 12, a rotary wafer carrier 13, and a polishing agent supplying member 14. The rotary table assembly 12 comprises a rotary table 15 and a polishing pad 16 adhered on the upper surface of the rotary table 15. The rotary table 15 can rotate on a shaft 17 at a predetermined rotation speed by a driving device such as a motor. The rotary wafer carrier 13 is for holding with a vacuum chucking means or the like means to carry the wafer W on the polishing pad 16 of the rotary table assembly 12 so that the surface of the wafer W faces to the polishing pad 16. The wafer carrier 13 can rotate on a shaft 18 at a predetermined rotation speed and horizontally move on the polishing pad 16 by an appropriate driving device such as a motor. During operation of the apparatus 10, the wafer W held by the wafer carrier 13 is in contact with the polishing pad 16 and proper polishing loads are applied to the wafer W in a downward direction through the shaft 18 and the wafer carrier 13. The polishing agent supplying member 14 is for supplying a polishing agent 19 on the polishing pad 16 to supply it between the wafer W and the polishing pad 16.

In the following Experiment, Example and Comparative Examples, the back face of the wafer was first polished with the polishing apparatus 10 under conditions specified therein, and the front face of the wafer was then subjected to mirror polishing after turning over of the wafer.

EXPERIMENT 1

Condition:
Sample wafers: Czochralski-grown p-type, <100>-oriented, 150-mm-diameter, single crystal silicon wafer
Polishing pad: Nonwoven fabric (velour-type), hardness=80 (Asker C-scale)
Polishing agent: 10.0 vol % of AJ-1325 ($SiO_2$ 2 wt %, pH 11, trade name for a colloidal silica polishing agent manufactured by Nissan Chemical Industries, Ltd.), a polyolefin type fine particle material [CHEMIPEARL S650 (tradename for a polyolefin aqueous dispersion manufactured by Mitsui Petrochemical Industries, Ltd.)] and pure water (the rest)
Polishing load: 400 $g/cm^2$
Polishing time: 10 min.

Under the condition specified above, the amount (wt %) of the polyolefin type fine particle material was changed with 0.025, 0.1, 0.45 and 1.0. Also, the amount of pure water was changed for the total amount of the polishing agent so as to become 100 vol %. Using the polishing apparatus shown in FIG. 8, the back face of each sample wafer (two sheets for each test) was polished to measure the polishing rate in the polishing process. The results of the measurement are shown in FIG. 9.

Figure 9:
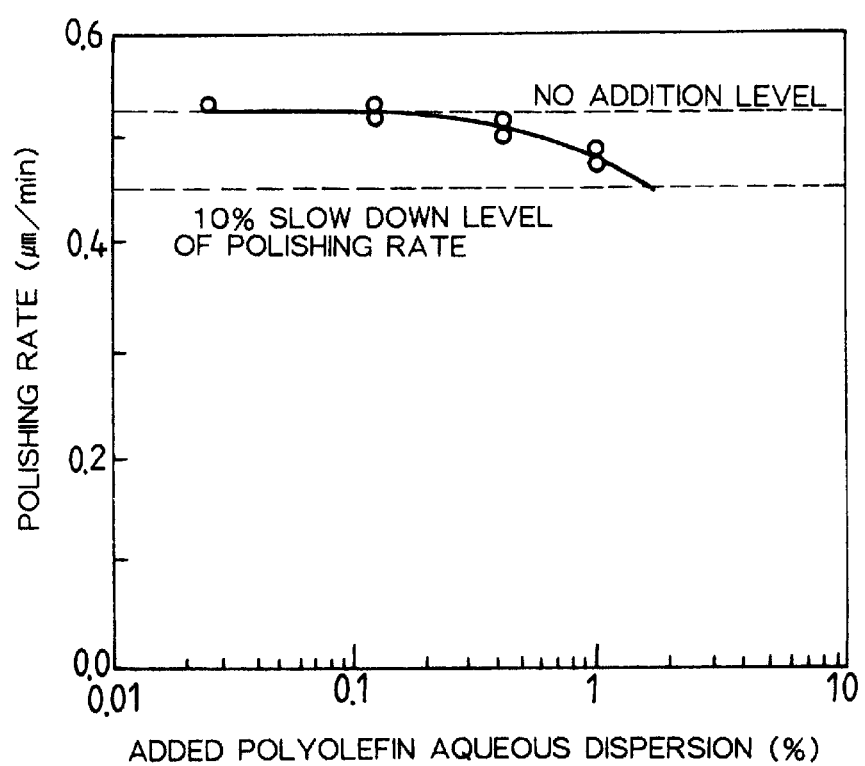
FIG. 9 is a graph of the relationship between the amount of the polyolefin type fine particle material and the polishing rate according to Example 1.
Figure 10:
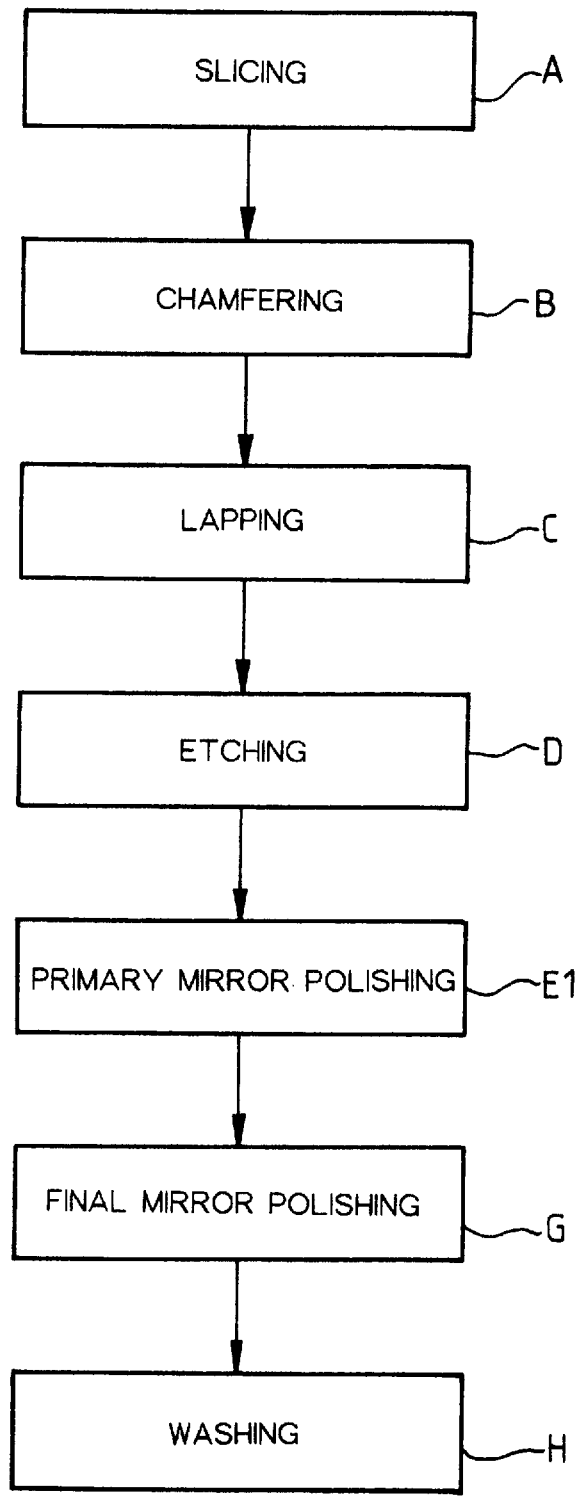
FIG. 10 is a flow chart showing one example of conventional manufacturing methods of semiconductor wafers.

As is apparent from the results of FIG. 9, against the level that the polyolefin type fine particle material was not added, we found that the degradation of polishing rate was seen little when the amount of the material was added in the range of 0.01 to 0.1 wt %, and that the polishing process could be performed without serious degradation of the polishing rate if the material was added in the range of 0.1 to 1%.

Example 1

Figure 1:
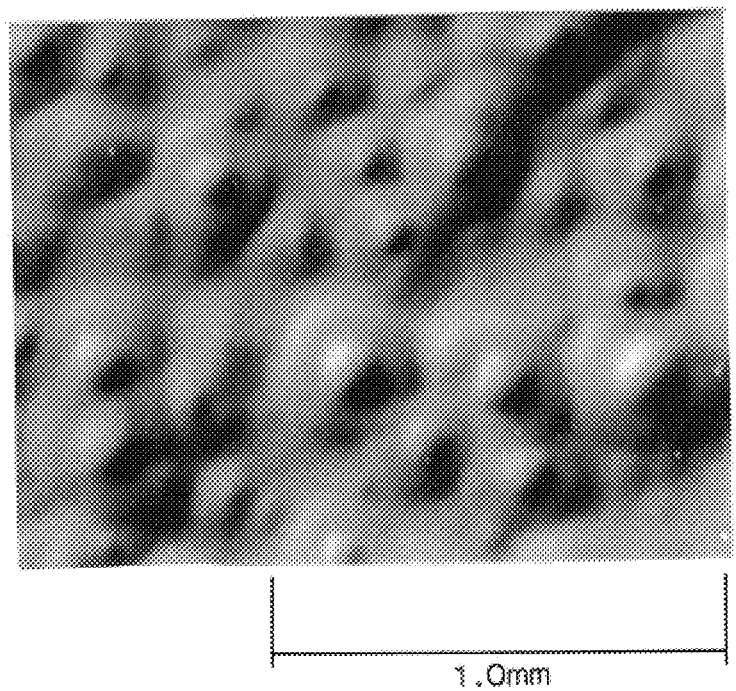
FIG. 1 is a photomicrograph of a wafer surface processed by low brightness polishing according to Example 1.
Figure 2A:
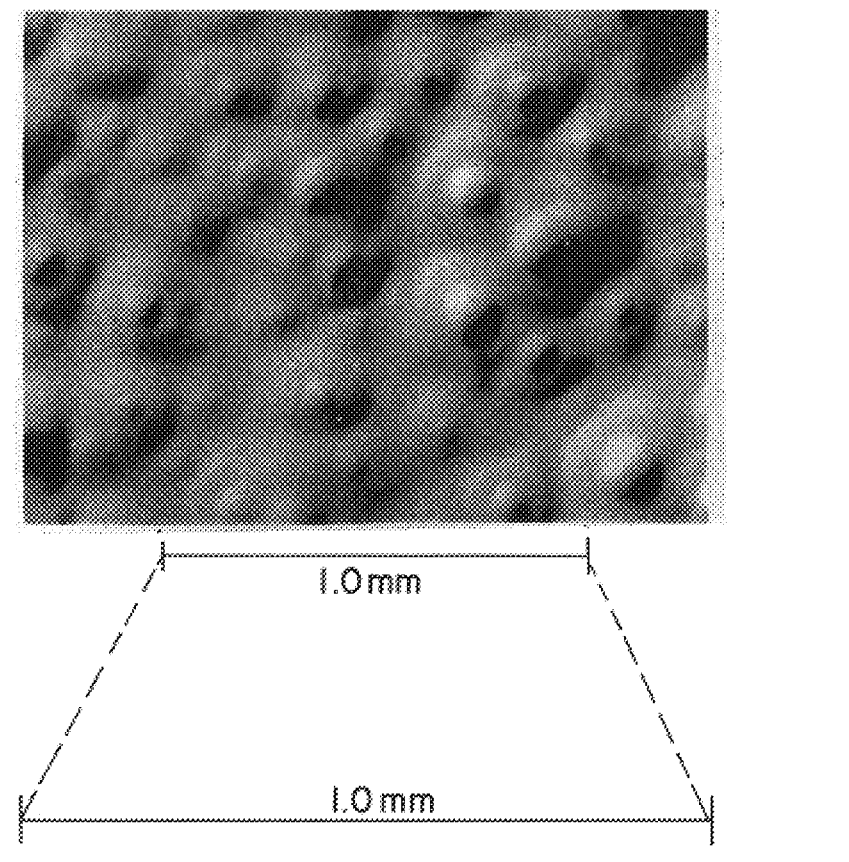
FIG. 2 is a photomicrograph of another surface portion of the wafer processed by low brightness polishing according to Example 1 and a graph showing the flatness of the surface portion.
Figure 2B:
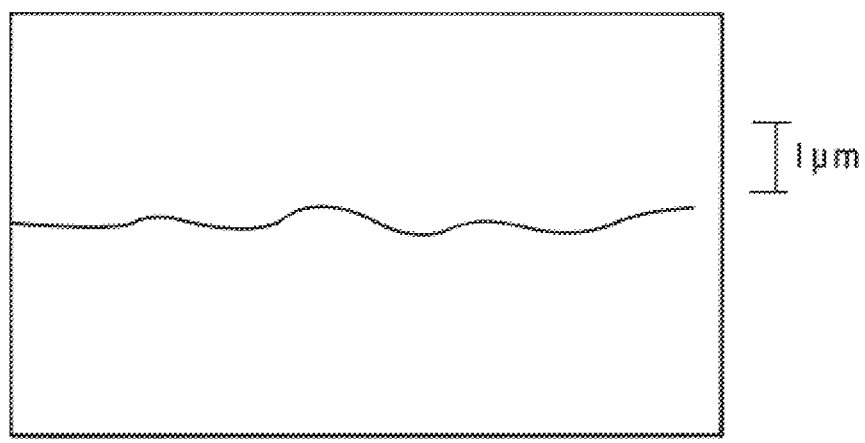

In the condition of Experiment 1, 0.025 wt % of CHEMIPEARL S650 (tradename for a polyolefin aqueous dispersion, manufactured by Mitsui Petrochemical Industries, Ltd.) was added while keeping the other conditions unchanged, and the back face of each sample wafer was then subjected to polishing. Thereafter, the sample wafer was turned over to make the front face of the wafer be subjected to mirror polishing using the same polishing apparatus. FIG. 1 is a photomicrograph of the back face of the sample wafer processed in Example 1. FIG. 2 is a photomicrograph of another back face portion of the same sample wafer together with a graph showing the undulations in the back face measured by a surface roughness tester.

Figure 3:
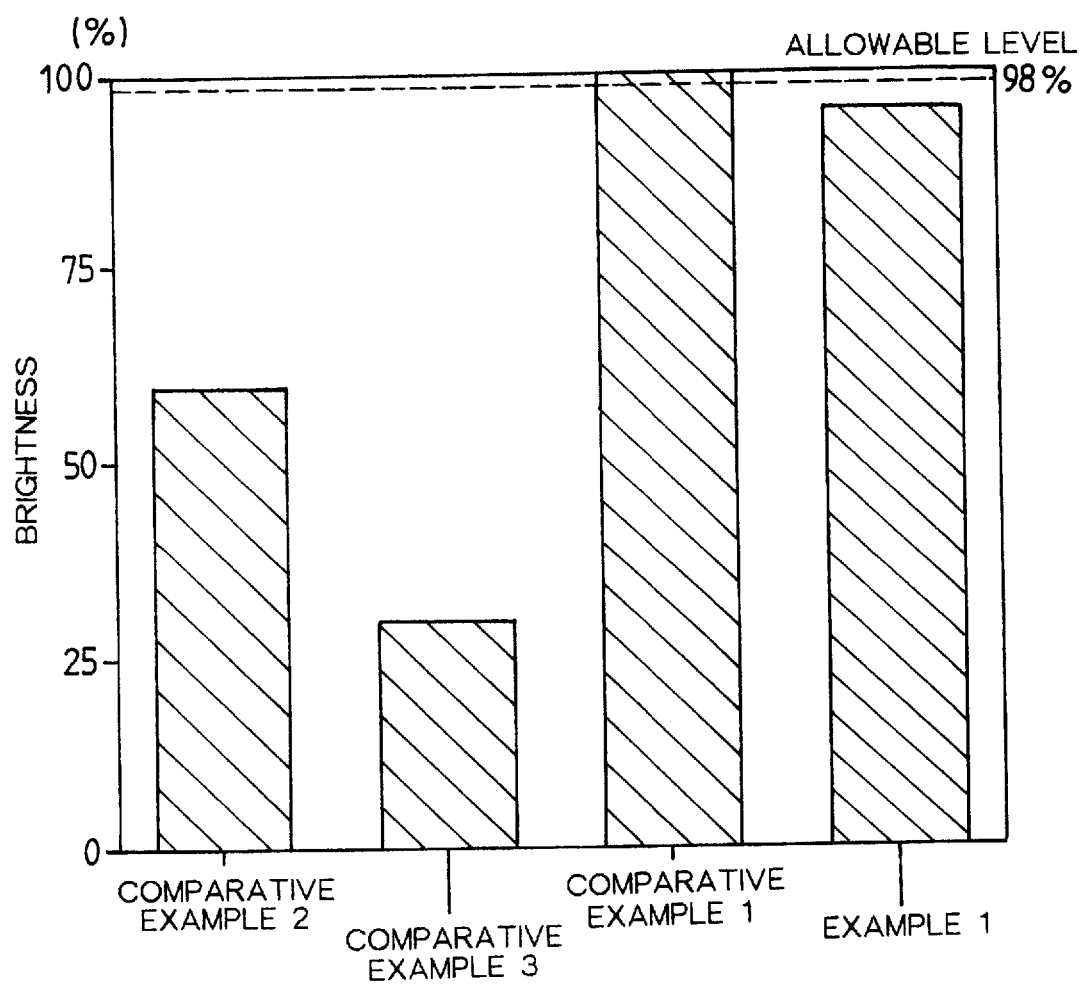
FIG. 3 is a graph showing results of the measurement on the brightness of wafer surfaces processed according to Example 1 and Comparative Examples 1 to 3.

Further, the brightness of the back face of the sample wafer was measured. The results of the measurement are shown in FIG. 3. As is apparent from FIGS. 1 and 2, semi-spherical small projections having a diameter of 50 to 500 µm and a height of 0.05 to 0.5 µm were formed. Also, as is seen from FIG. 3, the brightness was 95% which led to the fact that the low brightness polishing could be achieved.

Figure 4:
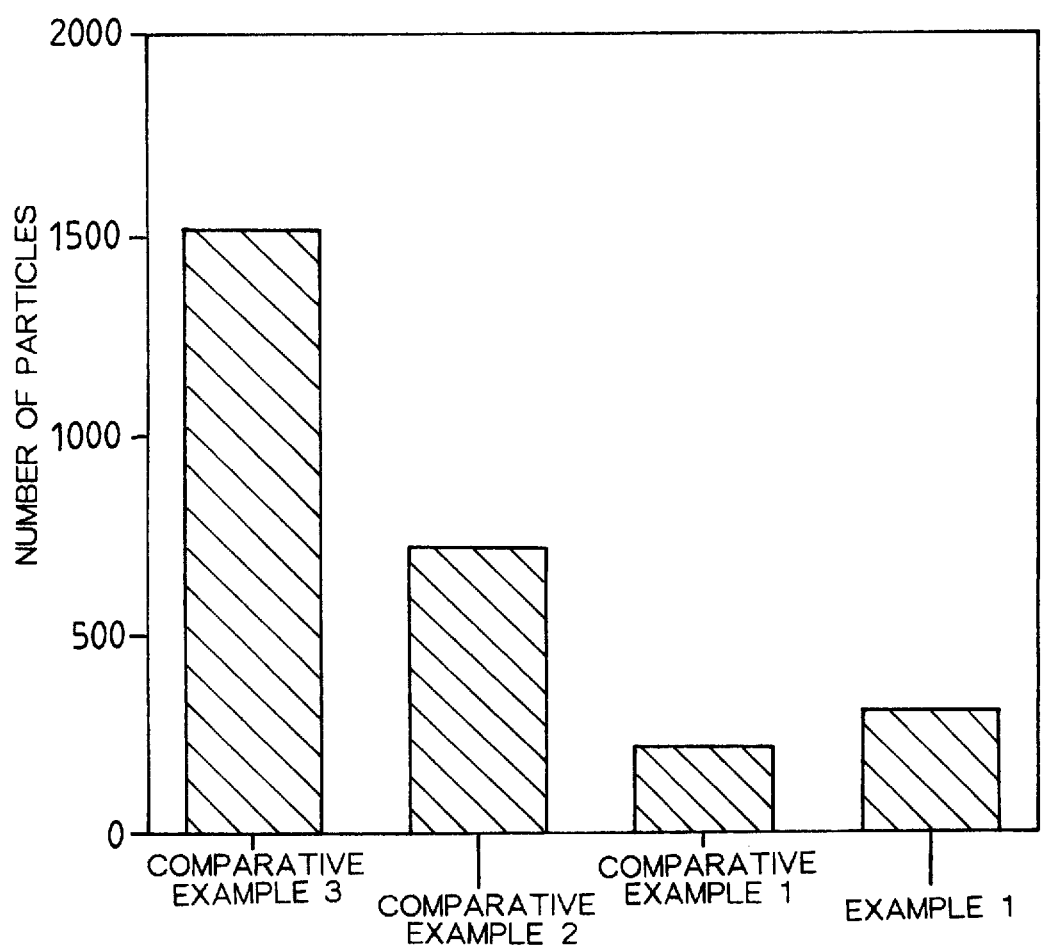
FIG. 4 is a graph showing results of the evaluation on the generation of dust of the wafer surfaces processed according to Example 1 and Comparative Examples 1 to 3.
Figure 5:
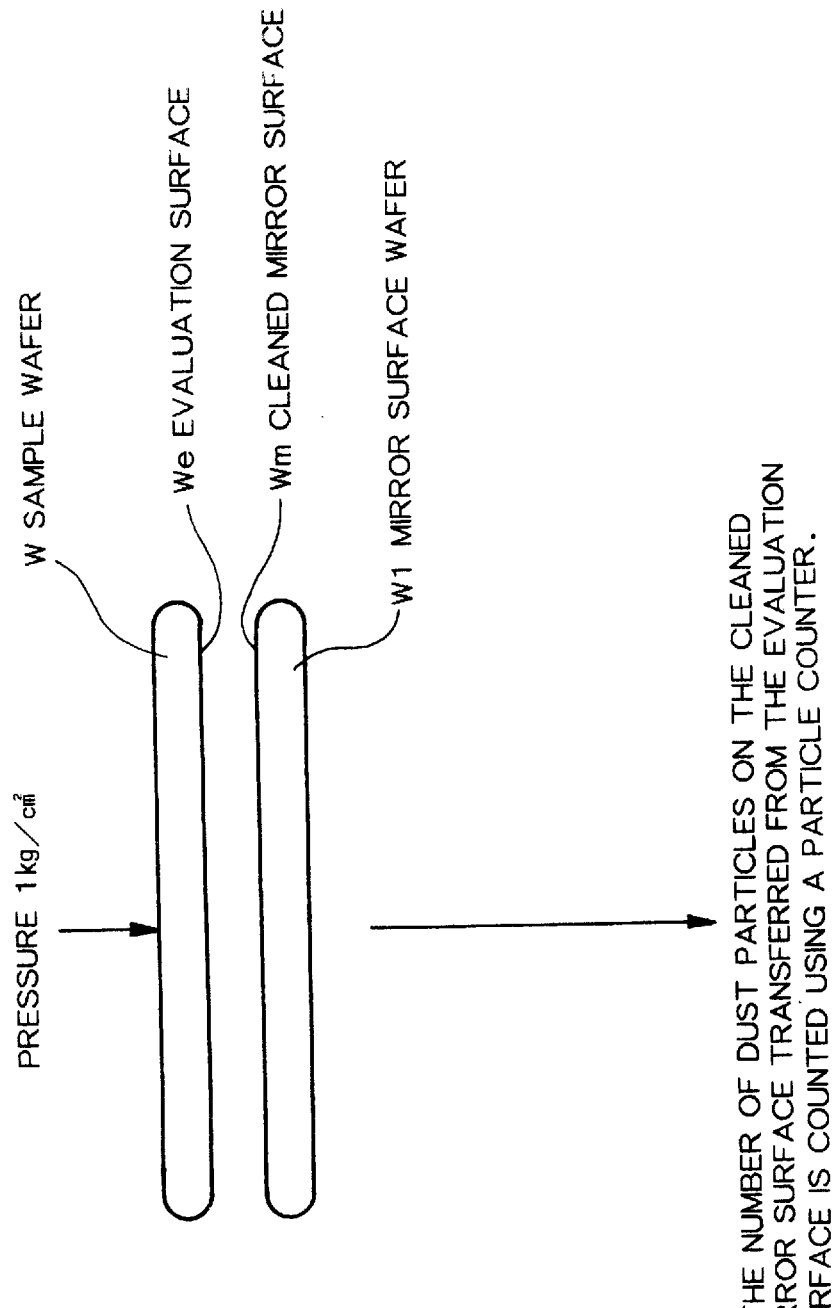
FIG. 5 is a diagram showing a method of evaluating the generation of dust of the wafer surfaces processed according to Example 1 and Comparative Examples 1 to 3.

As shown in FIG. 5, a surface We for evaluation of the sample wafer W was pressed with load of 1 kg/cm$^2$ against a cleaned mirror surface Wm of a mirror surface wafer W1. After the pressing step, the number of dust particles (the number of particles whose size was larger than 0.1 µm) on the cleaned mirror surface Wm transferred from the evaluation surface We of the sample wafer W onto the cleaned mirror surface Wm of the mirror surface wafer W1 was counted using a particle counter. The results of the couting are shown in FIG. 4 in which the dust generation for the low brightness polished surface We of the sample wafer W was evaluated.

As is clearly seen from FIG. 4, the number of the particles on the low brightness polished surface We was about 300. The result was near the number (200) of particles on the mirror polished surface described below. Thus, we could find that the dust generation in this Example was very low.

COMPARATIVE EXAMPLE 1

In the polishing condition of Experiment 1, 10 vol % of AJ-1325 (SiO$_2$ 2 wt %, pH 11, trade name for a colloidal silica polishing agent manufactured by Nissan Chemical Industries, Ltd.) and 90 vol % of pure water was used as the polishing agent while keeping the other condition unchanged, and both the front and back faces of each sample wafer were then subjected to mirror polishing.

Figure 6:
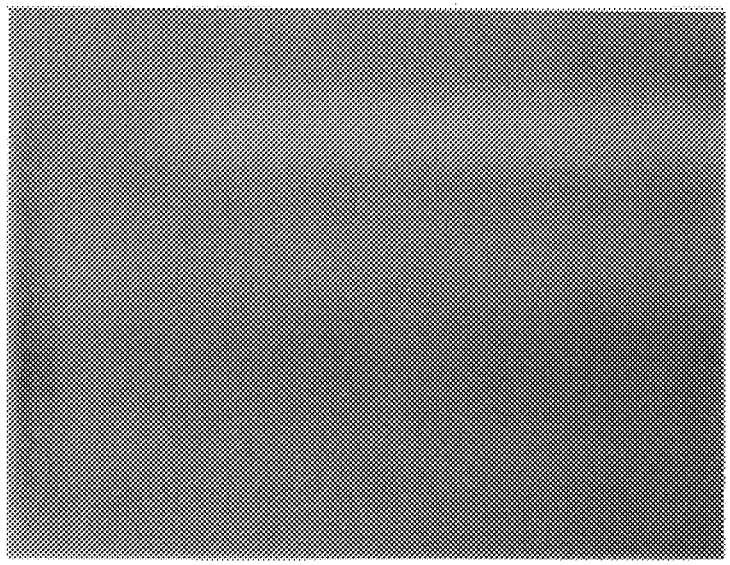
FIG. 6 is a photomicrograph of a wafer surface processed by mirror polishing according to Comparative Example 1.

FIG. 6 is a photomicrograph of the surface of the mirror polished wafer. The brightness was measured in the same manner as in Example 1, and the results of the measurement are shown in FIG. 3. Also, the evaluation on the dust generation was conducted in the same manner as in Example 1, and the results thereof are shown in FIG. 4. As is clearly seen from FIG. 6, undulations of large surface roughness on the mirror polished surface were not seen, and the brightness thereof was 100% as shown in FIG. 3. The number of particles counted to evaluate the dust generation was about 200 which was extremely low.

COMPARATIVE EXAMPLE 2

Figure 7:
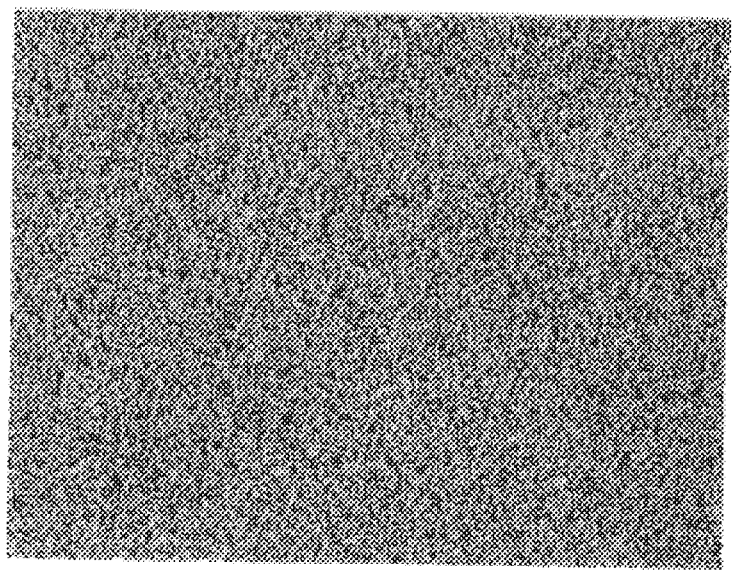
FIG. 7 is a photomicrograph of a wafer surface subjected to acid etching according to Comparative Example 2.

Using the same sample wafer as used in Experiment 1 which having been processed up to the etching process where acid etching was conducted, only the front face of the wafer was subjected to mirror polishing in the same condition as that in Experiment 1. FIG. 7 is a photomicrograph of the back face, that is, the acid etched surface of the sample wafer. As is apparent from FIG. 7, undulations of fine roughness were formed on the back face of the wafer, a cycle of which was less than 10 µm and a P–V (Peak to Valley) value of which was smaller than 0.6 µm. Also, the brightness on the acid etched surface, that is, the back face of the sample wafer was measured, and the results of the measurement are shown in FIG. 3. The dust generation for the acid etched surface or the back face was then evaluated in the same manner as in Example 1, and the results thereof are shown in FIG. 4. The brightness of the acid etched surface was 60% which was lower than that in Example 1. However, the number of particles counted to evaluate the dust generation was about 700 which was quite higher than that obtained in Example 1.

COMPARATIVE EXAMPLE 3

Using the same sample wafer as used in Experiment 1 which having been processed up to the etching process where alkaline etching was conducted, only the front face of the wafer was subjected to mirror polishing in the same condition as that in Experiment 1. The brightness on the back face, that is, the alkaline etched surface of the sample wafer was then measured, and the results of the measurement are shown in FIG. 3. Thereafter, the dust generation for the alkaline etched surface or the back face was evaluated in the same manner as in Example 1, and the results thereof are shown in FIG. 4. The brightness of the alkaline etched surface was 30% which was further lower than that in Comparative Example 2. However, the number of particles counted to evaluate the dust generation was about 1500 which was quite higher than that obtained in Comparative Example 2.

The same effect has been confirmed by experiment, even when n-type wafers have been used in place of the p-type wafers used in the examples described above.

Also, in the above Example, the polyolefin type fine particle material was added in the silica containing polishing agent. However, we have also confirmed that the same effect can be obtained even in case of adding agents, for example, ethylenediamine and the like which are usually added to the silica containing polishing agent.

As stated above, smooth semi-spherical projections can be formed on the back face of the wafer by polishing the face using the semiconductor wafer polishing agent of the present invention, thereby to lower the brightness of the back face of the wafer. Thus, sensor detection of the front and back faces of the wafer becomes possible, and the yield of semiconductor devices can be increased by suppressing the generation of dust to be caused by chipping on the back face of the wafer. In addition, it becomes possible to obtain a semiconductor wafer having a novel back face shape by using the semiconductor wafer polishing agent of the present invention.

Obviously, various minor changes and modifications of the present invention are possible in the light of the above teaching. It is therefore to be understood that within the scope of the appended claims the invention may be practiced otherwise than as specifically described.

What is claimed is:

1. A semiconductor wafer having front and back faces, wherein the front face is a mirror surface and the back face is a low brightness surface having a number of semi-spherical projections having a height in a range of 0.05 to 0.5 µm, and a diameter in a range of 50 to 500 µm and a brightness of 98% or less polished by a semiconductor wafer polishing agent comprising a silica containing polishing agent as a main component and a polyolefin type fine particle material as an additive.

2. A semiconductor wafer according to claim 1, wherein said silica containing polishing agent is a colloidal silica polishing agent.

3. A semiconductor wafer according to claim 1, wherein said polyolefin type fine particle material is a polyolefin aqueous dispersion.

4. A semiconductor wafer according to claim 2, wherein said polyolefin type fine particle material is a polyolefin aqueous dispersion.

5. A semiconductor wafer according to claim 1, wherein the amount of said polyolefin type fine particle material is in the range of 0.01 to 1 percent by weight.

6. A semiconductor wafer according to claim 2, wherein the amount of said polyolefin type fine particle material is in the range of 0.01 to 1 percent by weight.

7. A semiconductor wafer according to claim 3, wherein the amount of said polyolefin type fine particle material is in the range of 0.01 to 1 percent by weight.

8. A semiconductor wafer according to claim 4, wherein the amount of said polyolefin type fine particle material is in the range of 0.01 to 1 percent by weight.

* * * * *